(12) United States Patent
Kishimura et al.

(10) Patent No.: US 7,378,216 B2
(45) Date of Patent: May 27, 2008

(54) RESIST MATERIAL AND PATTERN FORMATION METHOD

(75) Inventors: Shinji Kishimura, Hyogo (JP); Masayuki Endo, Osaka (JP); Masaru Sasago, Osaka (JP); Mitsuru Ueda, Tokyo (JP); Hirokazu Imori, Aichi (JP); Toshiaki Fukuhara, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 250 days.

(21) Appl. No.: 11/128,438

(22) Filed: May 13, 2005

(65) Prior Publication Data

US 2005/0266337 A1 Dec. 1, 2005

(30) Foreign Application Priority Data

May 27, 2004 (JP) ............................. 2004-157420
Apr. 26, 2005 (JP) ............................. 2005-128359

(51) Int. Cl.
*C08F 12/30* (2006.01)
*G03F 7/00* (2006.01)
*G03F 7/004* (2006.01)

(52) U.S. Cl. ................... 430/270.1; 526/288; 526/242; 526/313; 526/319; 526/329.7; 430/311

(58) Field of Classification Search ..................... None
See application file for complete search history.

(56) References Cited

U.S. PATENT DOCUMENTS

| 4,491,628 | A | 1/1985 | Ito et al. | |
|---|---|---|---|---|
| 5,310,619 | A | 5/1994 | Crivello et al. | |
| 5,362,607 | A | 11/1994 | Crivello et al. | |
| 6,420,503 | B1 * | 7/2002 | Jayaraman et al. | 526/257 |
| 2004/0161698 | A1 * | 8/2004 | Kanagasabapathy et al. | 430/270.1 |
| 2005/0186501 | A1 * | 8/2005 | Kishimura et al. | 430/270.1 |

FOREIGN PATENT DOCUMENTS

| JP | 63-027829 | 2/1988 |
|---|---|---|
| JP | 02-027660 | 6/1990 |
| JP | 09-073173 | 3/1997 |
| JP | 09-230595 | 9/1997 |
| JP | 10-010739 A | 1/1998 |
| JP | 2000-330289 | 11/2000 |
| JP | 2002-250215 A | 9/2002 |
| WO | WO 97/33198 | 9/1997 |

OTHER PUBLICATIONS

Fujigaya et al, "New Photoresist Materials for 157-nm Lithography. Poly[Vinylsulfonyl Fluoride-co-4-(1, 1, 1, 3, 3, 3-hexafluoro-2-hydroxypropyl)-styrene] Partially Protected with tert-Butoxycarbonyl", Chemistry of Material, vol. 15, No. 7, pp. 1512-1517 (2003).*
Fujigaya et al., "A New Photoresist Material for 157 nm Lithography-2"; *Journal of Photopolymer Science and Technology:* c. 2002; pp. 643-654; vol. 15, No. 4 Polymer Handbook 4th Edition; 11-309; Wiley—Interscience.

* cited by examiner

*Primary Examiner*—Amanda Walke
(74) *Attorney, Agent, or Firm*—McDermott Will & Emery LLP

(57) ABSTRACT

A resist material has a base polymer containing a compound including a copolymer of a first unit represented by a general formula of the following Chemical Formula 1 and a second unit represented by a general formula of the following Chemical Formula 2:

Chemical Formula 1:

-continued

Chemical Formula 2:

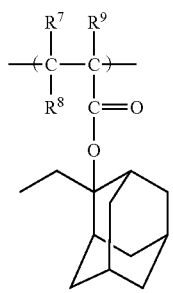

wherein $R^1$, $R^2$, $R^3$, $R^7$, and $R^8$ are the same or different and are a hydrogen atom, a fluorine atom, or a straight-chain alkyl group, a branched or cyclic alkyl group or a fluoridated alkyl group with a carbon number not less than 1 and not more than 20; $R^4$ is a straight-chain alkylene group or a branched or cyclic alkylene group with a carbon number not less than 0 and not more than 20; $R^5$ and $R^6$ are the same or different and are a hydrogen atom, a straight-chain alkyl group, a branched or cyclic alkyl group or a fluoridated alkyl group with a carbon number not less than 1 and not more than 20, or a protecting group released by an acid; and $R^9$ is a fluorine atom, or a straight-chain alkyl group, a branched or cyclic alkyl group or a fluoridated alkyl group with a carbon number not less than 1 and not more than 20.

22 Claims, 3 Drawing Sheets

RESIST MATERIAL AND PATTERN FORMATION METHOD

CROSS-REFERENCE TO RELATED APPLICATIONS

This application claims priority under 35 U.S.C. §119 on Patent Application No. 2004-157420 filed in Japan on May 27, 2004, and No. 2005-128359 filed in Japan on Apr. 26, 2005, the entire contents of which are hereby incorporated by reference.

BACKGROUND OF THE INVENTION

The present invention relates to a resist material or a chemically amplified resist material suitably used in refinement technique and a pattern formation method using the resist material.

In accordance with recent increase of the degree of integration and the operation speed of an LSI, there are increasing demands for refinement of an interconnect pattern rule.

The refinement of the interconnect pattern rule has been rapidly developed because of increased NA of a projection lens, improved performance of a resist material, a reduced wavelength of exposing light and the like.

With respect to increase of resolution and sensitivity of a resist material, a positive chemically amplified resist material using, as a catalyst, an acid generated through irradiation with exposing light exhibits high performance and hence has become a leading resist material particularly in the field of deep UV lithography (see Japanese Patent Publication No. 2-27660 and Japanese Laid-Open Patent Publication No. 63-27829).

Also, reduction of the wavelength of the exposing light from i line (of a wavelength of a 365 nm band) to KrF excimer laser (of a wavelength of a 248 nm band) has brought a large technical innovation, and a resist material for the KrF excimer laser was applied to 0.30 μm process at first and to a 0.18 μm rule in the course of time and is now applied to mass-production employing a 0.15 μm rule.

Furthermore, a 0.13 μm rule has already been studied. Thus, the speed for development in the refinement has been increasing, and hence, it is necessary to further improve transparency and substrate adhesiveness of a resist material.

It is expected that the design rule can be further refined to 90 nm or less by using ArF excimer laser (of a wavelength of a 193 nm band) as the exposing light. However, a conventionally used resin such as a Novolac resin or a poly(vinylphenol)-based resin has strong absorption in the vicinity of the wavelength of the 193 nm band, and hence cannot be used as a base polymer for a resist film in this case.

Therefore, for attaining transparency and dry etching resistance, use of an acrylic resin or a cycloolefin-based alicyclic resin as a base polymer has been examined (see Japanese Laid-Open Patent Publication Nos. 9-73173, 10-10739 and 9-230595 and International Bureau pamphlet numbered WO97/33198).

The other references related to the background of the invention are Japanese Laid-Open Patent Publication Nos. 2000-330289 and 2002-250215; Tsuyohiko FUJIGAYA, Shinji ANDO, Yuji SHIBASAKI, Mitsuru UEDA, Shinji KISHIMURA, Masayuki ENDO and Masaru SASAGO, "New Photoresist Material for 157 nm Lithography-2", J. Photopolym. Sci. Technol., 15(4), 643-654(2002); and Polymer Handbook 4th Edition, 11-309, Wiley-Interscience.

An acrylic resin has, however, a problem that a resultant resist pattern is in a poor shape when it is used as a base polymer because it swells in development, and an alicyclic resin has a problem that solubility in a developer and substrate adhesiveness are degraded when it is used as a base polymer because it has a strong hydrophobic property.

On the other hand, $F_2$ laser (of a wavelength of a 157 nm band) is expected to attain refinement of the design rule to approximately 65 nm or less, but it is difficult to attain sufficient transparency of a base polymer. It has been found that an acrylic resin that is used as a base polymer in using ArF excimer laser does not transmit the $F_2$ laser at all, and that a cycloolefin-based resin having a carbonyl bond has strong absorption against the $F_2$ laser. Furthermore, poly(vinylphenol), which is used as a base polymer in using KrF excimer laser, has an absorption window (namely, a region that has high transparency because exposing light is not absorbed therein) in the vicinity of a wavelength of a 160 nm band, and hence the transmittance is slightly improved when it is used, but it has been found that the transmittance is still far from practical level (that is, transmittance of 40% or more).

SUMMARY OF THE INVENTION

In consideration of the aforementioned conventional problems, an object of the invention is providing a resist material and more specifically a chemically amplified resist material including at least two kinds of units that has high transmittance against exposing light of a wavelength of a 200 nm band, and in particular, deep UV such as KrF laser (of a wavelength of a 248 nm band) or ArF laser (of a wavelength of a 193 nm band) or vacuum UV such as $F_2$ laser (of a wavelength of a 157 nm band), $Kr_2$ laser (of a wavelength of a 146 nm band), KrAr laser (of a wavelength of a 134 nm band) or $Ar_2$ laser (of a wavelength of a 126 nm band), is good at substrate adhesiveness, does not swell in development and exhibits high solubility in a developer; and a pattern formation method using the resist material.

As described above, since a carbonyl group or a double bond of carbon has absorption in the vicinity of the 157 nm band, it seems to be one effective method for improving the transmittance to reduce such a unit.

Furthermore, it has been found through recent study that transparency is remarkably improved in the vicinity of the 157 nm band by introducing a fluorine atom into a base polymer. Actually, a polymer in which fluorine is introduced into an aromatic ring of poly(vinylphenol) attains transmittance at almost practical level.

It has been found, however, that such a base polymer has high transparency against $F_2$ laser but is difficult to practically use in a resist material because a negative reaction is largely proceeded through irradiation with the laser.

Also, it has been found that an acrylic polymer or a polymer in which fluorine is introduced into a polymer compound having, on a main chain, an aliphatic cyclic compound obtained from a norbornene derivative has high transparency and is free from the negative reaction. However, it has been also found that the substrate adhesiveness and solubility in a developer of a resist film tend to be degraded when the introducing rate of fluorine is increased for further improving the transparency.

The present inventors have earnestly made examination for achieving the object, resulting in finding the following: When a base polymer containing a copolymer compound including a unit having a sulfonamide group on a side chain and an acrylic unit having an ethyladamantyl group bonded to the terminal of an ester group is used, a resist material that attains high transparency of a resultant resist film against an exposing light source, has high substrate adhesiveness, does not swell in development and exhibits high solubility in a developer, and particularly, a base polymer with high polymerization uniformity that includes at least two kinds of units mixed in a well balanced manner, can be obtained.

First, the improvement in the transparency and the effect attained by the improvement will be described.

It has been found that a base polymer including a unit having a sulfonamide group on a side chain has high transparency against exposing light of a wavelength of a 300 nm band or less although it includes two sulfur-oxygen double bonds. A unit having a sulfonamide group on a side chain can construct a base polymer without utilizing a carbonyl group on any side chain of the base polymer. Accordingly, since the base polymer can be constructed while suppressing mixture of a carbonyl group, which has a high absorbing characteristic against exposing light of a wavelength of a 200 nm band in particular, the transparency of a resultant resist film against exposing light of a shorter wavelength band can be improved.

As a result, since the exposing light used in pattern exposure reaches the bottom of the resist, an exposed portion of the resist is changed to be developable even at the bottom of the resist or a sufficient amount of acid is generated from an exposed portion so as to change the exposed portion to be developable even at the bottom of the resist. Thus, a good resist pattern can be formed.

Also, when a plurality of $CF_3$ groups are introduced into the base polymer, the transparency of the resultant resist film against exposing light is improved. This is because when there exist a plurality of F atoms, the absorption peak of the exposing light against a resist film having a structure in which F atoms are not substituted is shifted, and hence, the initial absorption band of the exposing light is shifted.

Next, the improvement of the polymerization uniformity and the effect attained by this improvement will be described.

In the base polymer of this invention, the unit having a sulfonamide group on a side chain and the acrylic unit having an ethyladamantyl group bonded to the terminal of an ester group are polymerized in comparatively uniform ratios.

The ratios of the unit having a sulfonamide group on a side chain and the acrylic unit having an ethyladamantyl group bonded to the terminal of an ester group are comparatively uniform because the reaction speed in the polymerization reaction of the acrylic unit can be approximated to the reaction speed of the unit having a sulfonamide group on a side chain by allowing an ethyladamantyl group to bond to the terminal of the ester group of the acrylic unit.

A unit generally used as an acrylic resin is an acrylic unit having a methyladamantyl group, in which a methyl group is bonded to the bonding position of an adamantly group and an ester group, on the terminal. An adamantyl group itself is a sterically large substituent group. In a chemical reaction such as a polymerization reaction, the reaction speed dominantly depends upon a combination of an electronic factor and a steric factor, and therefore, in order to increase the reaction speed, a substituent group of a unit used in the polymerization reaction is preferably a group that is highly electrically stable and has a small molecular volume for reducing steric hindrance. Accordingly, a substituent group to be further bonded to an adamantyl group is preferably a sterically small substituent group, and hence, a methylada- mantyl group in which a sterically small methyl group with a stable structure is bonded is generally used.

On the other hand, since the unit having a sulfonamide group on a side chain has a sulfonamide group including a sulfur atom having a larger atomic radius than carbon and an oxygen atom, it has a comparatively large volume, and the polymerization reactivity of the unit having a sulfonamide group on a side chain is lower than that of an acrylic unit having an ester group on a side chain. When a sulfonamide group and a methyladamantyl group are singly compared with each other, the volume is larger in the methyladamantyl group, but since the polymerization reaction occurs with α-carbon on a main chain set as a reaction point, the influence of the steric hindrance on the polymerization reaction speed based on the volume is larger in a position closer to carbon on the main chain. In other words, in the acrylic unit, an ester group bonded to α-carbon on the main chain has a small volume and has high radical stability, the polymerization reactivity is higher than that of the unit having a sulfonamide group but not having an ester group.

In other words, when a unit having a sulfonamide group on a side chain is simply introduced into an acrylic resin so as to polymerize an acrylic unit having a methyladamantyl group on the terminal and the unit having a sulfonamide group on a side chain, the polymerization reaction of the acrylic unit with high reactivity is proceeded priorly, and hence, the unit having a sulfonamide group cannot be sufficiently introduced into the acrylic resin.

Therefore, when an acrylic unit is constructed by replacing a methyladamantyl group present on the terminal of a conventional acrylic unit with an ethyladamantyl group, the steric hindrance of the acrylic unit caused in the polymerization reaction is increased so as to reduce the reaction speed.

Accordingly, the polymerization reactivity of the acrylic unit can be made close to the polymerization reactivity of the unit having a sulfonamide group on a side chain, and hence, the base polymer in which the different kinds of units are copolymerized in comparatively uniform ratios can be obtained. As a result, edge roughness of a resultant resist pattern occurring in etching is suppressed, so as to provide a resist pattern with high etching resistance.

Now, the relationship between the polymerization uniformity of a base polymer and the etching resistance will be described.

When the reactivity of two kinds of units is substantially equal to each other, the arrangement of the units can be easily made comparatively homogeneous in the base polymer. For example, when an acrylic unit having an ethyladamantyl group on the terminal is designated as a unit A and a unit having a sulfonamide group on a side chain is designated as a unit B, as the polymerization reaction speeds of the units A and B are closer to each other, it is easier to form a polymer in which the different units are alternately arranged like ABABAB . . . or a polymer in which given units of respective constituting elements are arranged without being imbalanced to one of them like AAABB- BAAABBB . . .

In this manner, a polymer including at least two kinds of different units tends to have a structure in which molecules are engaged with one another like, for example, a key and a keyhole, and therefore, it has large intermolecular bond strength as compared with a polymer in which one kind of units are linearly linked with one another. Accordingly, in etching or the like, a portion in which two kinds of units are engaged has larger strength against physical impact caused in the etching and hence the bond therein is minimally cut as compared with a portion including a single kind of units. In other words, in performing pattern formation through etching using a resist pattern as a mask, the bonds between the polymer units included in the resist pattern are minimally cut by impact caused in the etching, and therefore, the surface of the resist pattern is minimally partially broken, namely, the etching resistance is improved. As a result, roughness otherwise caused on the surface of the resist film can be prevented.

In the case where a resist is a chemically amplified resist including the base polymer and an acid generator, an acrylic unit represented by Chemical Formula 7 below is cut by an acid generated in exposure in a position indicated by a broken line A, so as to be changed to a developable state. At this point, the compound having the ethyladamantyl group is improved in the electron stability on oxygen owing to an ethyl group on a side chain or it is improved in the electron stability because $H_2O$ is detached from ethyladamantyl having a hydroxyl group after the detachment, and therefore, the solubility in a developer is improved.

Chemical Formula 7:

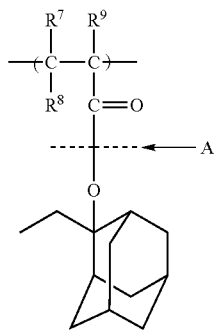

Also, when a hydroxyl group with high polarity, is bonded to a side chain of a compound, it is easily interacted with another polar group, and in particular, chemical interaction is easily caused with a constituting material of an underlying film. Therefore, the adhesiveness can be improved.

In a sulfonamide group, an oxygen atom with a strong negative property and large polarity and a sulfur atom are bonded through a double bond and a nitrogen atom that can easily attain a positive property is bonded to the sulfur atom, and hence, free electrons on the oxygen atom not related to the bond to the sulfur atom are present in a delocalized state. Therefore, when the unit having a sulfonamide group is used as the base polymer, a portion of the base polymer corresponding to the sulfonamide group exhibits strong polarity, and hence, electronic interaction is easily caused between the sulfonamide group and a substrate particularly in the case where the underlying substrate is made of an inorganic material, or strong interaction is caused between the sulfonamide group and an alkaline group included in a developer. As a result, the substrate adhesiveness of the resist film is improved and solubility of an exposed portion in the developer is improved.

Furthermore, it has been found that swell of the resist can be suppressed when the base polymer has a sulfonamide group.

A conventional resist material including acrylic ester alone has, on a side chain, a unit that is changed into a carboxylic acid group through exposure as a unit for causing a reaction with the developer. In a carboxylic acid group, a H atom and an O atom interacts with each other through a hydrogen bond as shown in Chemical Formula 8 below, and hence, the carboxylic acid group tends to form a hexagonal structure in which two molecules oppose each other. Since electrons form an octet in this hexagonal structure, the structure is stereo-chemically stable. When bonds having such a structure are generated in various portions of the base polymer after the exposure, three-dimensional bonds tend to be formed between the side chains of the polymer, and hence the polymer is easily formed in a mesh structure. As a result, the resist film swells.

Chemical Formula 8:

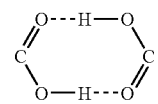

On the other hand, the resist material of this invention includes a unit having a sulfonamide group on a side chain in addition to the acrylic ester unit as a unit for causing a reaction with a developer after the exposure. In a sulfonamide group, bonds mutually easily coupled cannot be formed owing to its structure differently from a carboxylic acid group. Therefore, even when the unit that can react with a developer is formed after the exposure, the terminal groups of the base polymer minimally form three-dimensional bonds, and a mesh structure is minimally formed. As a result, the swell of the resist film can be suppressed.

The present invention was devised on the basis of the aforementioned findings, and is specifically practiced as follows:

The resist material of this invention includes a base polymer containing a compound including a copolymer of a first unit represented by a general formula of the following Chemical Formula 9 and a second unit represented by a general formula of the following Chemical Formula 10:

Chemical Formula 9:

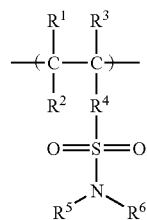

Chemical Formula 10:

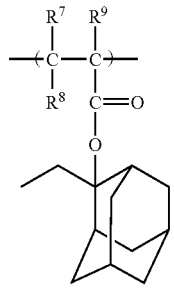

wherein $R^1$, $R^2$, $R^3$, $R^7$ and $R^8$ are the same or different and are a hydrogen atom, a fluorine atom, or a straight-chain alkyl group, a branched or cyclic alkyl group or a fluoridated alkyl group with a carbon number not less than 1 and not more than 20; $R^4$ is a straight-chain alkylene group or a branched or cyclic alkylene group with a carbon number not less than 0 and not more than 20; $R^5$ and $R^6$ are the same or different and are a hydrogen atom, a straight-chain alkyl group, a branched or cyclic alkyl group or a fluoridated alkyl group with a carbon number not less than 1 and not more than 20, or a protecting group released by an acid; and $R^9$ is a fluorine atom, or a straight-chain alkyl group, a branched or cyclic alkyl group or a fluoridated alkyl group with a carbon number not less than 1 and not more than 20.

In the resist material of this invention, since the first unit has a sulfonamide group ($SO_2N$) on a side chain, the sulfur atom (S) included in the sulfonamide group attains positive polarity while the oxygen atom (O) included in the sulfonamide group attains negative polarity, and therefore, the compound including the sulfonamide group attains a high hydrophilic property. Also, as the second unit, an acrylic unit having an ethyladamantyl group on the terminal of a side chain is bonded. Therefore, the polymerization reaction speed of the second unit is approximated to the polymerization reaction speed of the first unit, and hence, the polymerization uniformity between the first unit and the second unit is improved. Accordingly, the transparency and the etching resistance of a resultant resist film are improved.

In the resist material of the invention, the base polymer preferably further includes an acid generator for generating an acid through irradiation with light. Thus, a positive chemically amplified resist material having the aforementioned effect can be realized.

In the resist material of the invention, the base polymer preferably further includes a dissolution inhibitor for inhibiting dissolution of the base polymer. Thus, the dissolution contrast of the resultant resist film is improved.

In the resist material of the invention, the compound including the copolymer preferably has a structure in which the first unit and the second unit are alternately arranged.

Thus, the balance of the whole polymer is improved and the skeleton strength of the polymerized resin is increased. Therefore, the etching resistance is improved, so that a resist pattern can be formed in a good shape.

In the resist material of the invention, the protecting group released by an acid is preferably an acetal group.

Thus, since an acetal group includes an ether bond and has an unpaired electron pair on an oxygen atom, it has high reactivity with an acid. In other words, it needs smaller activation energy for reacting with an acid. Therefore, the protecting group of the acetal group can be easily released by an acid. A sulfonamide compound including an acetal protecting group can be obtained, for example, by reacting a sulfonamide compound with a vinyl ether compound or methyl ether halide.

In the resist material of the invention, the acetal group is preferably an alkoxyethyl group or an alkoxymethyl group.

Examples of the alkoxyethyl group are an adamantyloxyethyl group, a t-butyloxyethyl group, an ethoxyethyl group and a methoxyethyl group. For example, an adamantyloxyethyl group can be obtained by reacting a sulfonamide compound with vinyl adamantane ether.

Examples of the alkoxymethyl group are an adamantyloxymethyl group, a t-butyloxymethyl group, an ethoxymethyl group and a methoxymethyl group. For example, an adamantyloxymethyl group can be obtained by reacting a sulfonamide compound with chloromethyl adamantane ether.

The first pattern formation method of this invention includes the steps of forming a resist film having a base polymer containing a compound including a copolymer of a first unit represented by a general formula of the following Chemical Formula 11 and a second unit represented by a general formula of the following Chemical Formula 12; performing pattern exposure by selectively irradiating the resist film with exposing light of high energy beams of a wavelength not shorter than a 100 nm band and not longer than a 300 nm band or not shorter than a 1 nm band and not longer than a 30 nm band or electron beams; and forming a resist pattern by developing the resist film after the pattern exposure:

Chemical Formula 11:

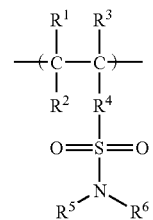

Chemical Formula 12:

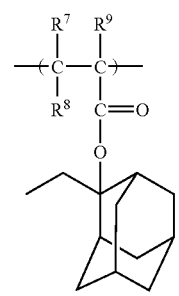

wherein $R^1$, $R^2$, $R^3$, $R^7$ and $R^8$ are the same or different and are a hydrogen atom, a fluorine atom, or a straight-chain alkyl group, a branched or cyclic alkyl group or a fluoridated alkyl group with a carbon number not less than 1 and not more than 20; $R^4$ is a straight-chain alkylene group or a branched or cyclic alkylene group with a carbon number not less than 0 and not more than 20; $R^5$ and $R^6$ are the same or different and are a hydrogen atom, a straight-chain alkyl group, a branched or cyclic alkyl group or a fluoridated alkyl group with a carbon number not less than 1 and not more than 20, or a protecting group released by an acid; and $R^9$ is a fluorine atom, or a straight-chain alkyl group or a branched or cyclic alkyl group or a fluoridated alkyl group with a carbon number not less than 1 and not more than 20.

The second pattern formation method of this invention includes the steps of forming a resist film having a base polymer containing a compound including a copolymer of a first unit represented by a general formula of the following Chemical Formula 13 and a second unit represented by a general formula of the following Chemical Formula 14; providing a liquid onto the resist film; performing pattern exposure by selectively irradiating the resist film with exposing light of high energy beams of a wavelength not shorter than a 100 nm band and not longer than a 300 nm band or not shorter than a 1 nm band and not longer than a 30 nm band or electron beams; and forming a resist pattern by developing the resist film after the pattern exposure:

Chemical Formula 13:

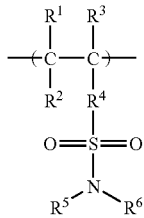

Chemical Formula 14:

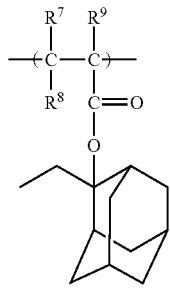

wherein $R^1$, $R^2$, $R^3$, $R^7$ and $R^8$ are the same or different and are a hydrogen atom, a fluorine atom, or a straight-chain alkyl group, a branched or cyclic alkyl group or a fluoridated alkyl group with a carbon number not less than 1 and not more than 20; $R^4$ is a straight-chain alkylene group or a branched or cyclic alkylene group with a carbon number not less than 0 and not more than 20; $R^5$ and $R^6$ are the same or different and are a hydrogen atom, a straight-chain alkyl group, a branched or cyclic alkyl group or a fluoridated alkyl group with a carbon number not less than 1 and not more than 20, or a protecting group released by an acid; and $R^9$ is a fluorine atom, or a straight-chain alkyl group or a branched or cyclic alkyl group or a fluoridated alkyl group with a carbon number not less than 1 and not more than 20.

In the first or second pattern formation method of the invention, the base polymer contains the compound including a unit having a sulfonamide group on a side chain (namely, the first unit) and a unit having an ethyladamantyl group on the terminal of an ester group (namely, the second unit).

In these methods, since the first unit included in the base polymer has a sulfonamide group, the sulfur atom included in the sulfonamide group attains positive polarity while the oxygen atom included in the sulfonamide group attains negative polarity, and therefore, the unit including the sulfonamide group attains a high hydrophilic property. Accordingly, the resist film can be improved in the substrate adhesiveness. Furthermore, since the resist film is free from swell and good at solubility in a developer, the resist pattern is formed in a good shape. Also, since the base polymer includes the two kinds of units with high polymerization uniformity, the etching resistance is improved so as to particularly reduce edge roughness of the resist pattern. Moreover, although the base polymer has the sulfonamide group on the side chain of the unit and includes two sulfur-oxygen double bonds, it has high transmittance against the exposing light of a wavelength of a 300 nm band or less, and in the case where a F atom is included in the side chain, the absorption wavelength of the exposing light is shifted, resulting in accelerating the improvement of the transparency of the resist film.

In particular, in the second pattern formation method, the step of performing the pattern exposure is carried out by employing immersion lithography, and hence, the resolution of the resist film is improved. In the immersion lithography, a region between a condensing lens and a resist film formed on a wafer in an exposure system is filled with a liquid having a refractive index higher than that of the air. Thus, theoretically, the NA (numerical aperture of a lens) of the exposure system can be increased to the refractive index of the liquid at its best, resulting in improving the resolution of the resist film. Also, the focal depth can be increased by this method.

Specific effects obtained in this invention are as follows: Since the base polymer of the resist material has a sulfonamide group on the side chain in this invention, high resolution can be attained by employing the immersion lithography in particular. In a sulfonamide group, an oxygen atom having a strong negative property and large polarity and a sulfur atom are bonded through a double bond and a nitrogen atom that easily attains a positive polarity is bonded to the sulfur atom. Therefore, free electrons on the oxygen atom not related to the bond with the sulfur atom are present in a delocalized state. In other words, the sulfonamide group is a substituent group having high polarity, and therefore, when the base polymer includes a vinyl sulfonamide unit as in this invention, there are a plurality of sulfonamide groups on the side chains. Accordingly, electronic interaction (chemical interaction) is caused between an oxygen atom having a strong negative property of a sulfonamide group bonded to a side chain of one base polymer and a nitrogen atom having a strong positive property of a sulfonamide group bonded to a side chain of another base polymer, resulting in causing strong interaction between the base polymers included in the resist film.

Accordingly, even when the liquid is provided on the resist film in the exposure employing the immersion lithography, the strong interaction caused within the resist film brings a force for mutually holding substances included in the resist film. Therefore, a substance included in the resist film is minimally eluted from the resist film into the liquid. Also, the substituent groups are already bonded to one another through the chemical interaction within the base polymer included in the resist film, interaction is minimally caused between constituting molecules of the liquid employed in the exposure by the immersion lithography and the base polymer. Therefore, the liquid can be prevented from invading the resist film. As a result, high resolution peculiar to the exposure by the immersion lithography can be kept and the solubility in a developer can be high, so that stable pattern formation can be carried out.

In the first or second pattern formation method of the invention, when the base polymer further includes an acid generator for generating an acid through irradiation with light, the base polymer preferably functions as a chemically amplified resist. Thus, the protecting group of the base polymer is released by the acid generated through irradiation with light, so as to attain solubility in a developer.

In the first or second pattern formation method of the invention, the base polymer including an acid generator, namely, the chemically amplified resist, preferably further includes a dissolution inhibitor for inhibiting dissolution of the base polymer. Thus, the dissolution contrast of the resist film is improved.

In the first or second pattern formation method of the invention, the compound including the copolymer preferably has a structure in which the first unit and the second unit are alternately arranged.

Thus, the balance of the whole polymer is improved and the skeleton strength of the polymerized resin is increased. Therefore, the etching resistance is improved, so that the resist pattern can be formed in a good shape.

In the first or second pattern formation method of the invention, the protecting group released by an acid is preferably an acetal group.

Thus, since an acetal group includes an ether bond and has an unpaired electron pair on an oxygen atom, it has high reactivity with an acid. In other words, it needs smaller activation energy for reacting with an acid. Therefore, the protecting group of the acetal group can be easily released by an acid. A sulfonamide compound including an acetal protecting group can be obtained, for example, by reacting a sulfonamide compound with a vinyl ether compound or methyl ether halide.

In the first or second pattern formation method of the invention, the acetal group is preferably an alkoxyethyl group or an alkoxymethyl group.

Examples of the alkoxyethyl group are an adamantyloxyethyl group, a t-butyloxyethyl group, an ethoxyethyl group and a methoxyethyl group. For example, an adamantyloxyethyl group can be obtained by reacting a sulfonamide compound with vinyl adamantane ether.

Examples of the alkoxymethyl group are an adamantyloxymethyl group, a t-butyloxymethyl group, an ethoxymethyl group and a methoxymethyl group. For example, an adamantyloxymethyl group can be obtained by reacting a sulfonamide compound with chloromethyl adamantane ether.

In the second pattern formation method of the invention, the liquid may be water or perfluoropolyether.

In the first or second pattern formation method of the invention, the exposing light may be KrF laser, ArF laser, $F_2$ laser, $Kr_2$ laser, KrAr laser, $Ar_2$ laser or soft X-rays.

In the first or second pattern formation method of the invention, the base polymer preferably has a trifluoromethyl group on a side chain thereof.

As described so far, according to the invention, the resist material having the base polymer containing the compound including the copolymer of the unit having a sulfonamide group on a side chain and the acrylic unit having an ethyladamantyl group on the terminal of an ester group attains a high hydrophilic property because it has the sulfonamide group on the side chain. Therefore, since the substrate adhesiveness of the resist film is improved and the resist film is free from a swelling property and good at solubility in a developer, the resultant resist pattern can be formed in a good shape. Also, since it has the sulfonamide group on the side chain, it has high transmittance against the exposing light of a wavelength of a 300 nm band or less. Furthermore, since the reaction speed of the acrylic unit included in the copolymer and having the ethyladamantyl group bonded to the terminal of the ester group is approximated to the reaction speed of the unit having the sulfonamide group, the polymerization uniformity of the resist film can be improved. Accordingly, a resist material with high etching resistance can be provided.

DETAILED DESCRIPTION OF THE INVENTION

Embodiment 1

Figure 1A:
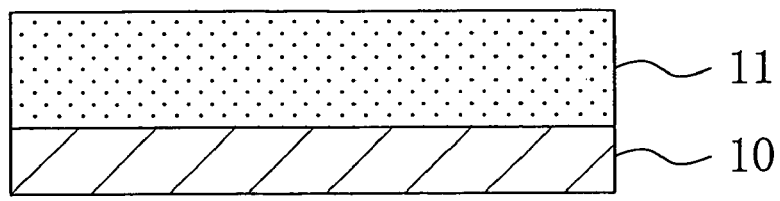
FIGS. 1A, 1B, 1C and 1D are cross-sectional views for showing procedures in a pattern formation method of Example 1 for embodying Embodiment 2 of the invention.

A resist material according to Embodiment 1 of the invention will now be described.

The resist material of Embodiment 1 includes a base polymer containing a compound including a copolymer of a first unit represented by a general formula of Chemical Formula 15 below and a second unit represented by a general formula of Chemical Formula 16 below. The weight average molecular weight of the polymer compound is not less than 1,000 and not more than 500,000 and preferably not less than 2,000 and not more than 100,000.

The resist material of Embodiment 1 may further include another polymer compound for the purpose of changing dynamical, thermal or other properties of a resultant film. In this case, the polymer compound to be further included is not particularly specified, and such an additional polymer compound is preferably included so that the proportion of the polymer including the first unit and the second unit can be 50% through 70% of the whole base polymer.

Chemical Formula 15:

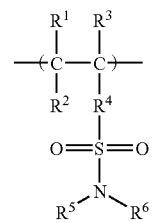

Chemical Formula 16:

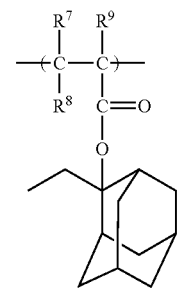

wherein $R^1$, $R^2$, $R^3$, $R^7$ and $R^8$ are the same or different and are a hydrogen atom, a fluorine atom, or a straight-chain alkyl group, a branched or cyclic alkyl group or a fluoridated alkyl group with a carbon number not less than 1 and not more than 20; $R^4$ is a straight-chain alkylene group or a branched or cyclic alkylene group with a carbon number not less than 0 and not more than 20; $R^5$ and $R^6$ are the same or different and are a hydrogen atom, a straight-chain alkyl group, a branched or cyclic alkyl group or a fluoridated alkyl group with a carbon number not less than 1 and not more than 20, or a protecting group released by an acid; and $R^9$ is a fluorine atom, or a straight-chain alkyl group, a branched or cyclic alkyl group or a fluoridated alkyl group with a carbon number not less than 1 and not more than 20.

In the polymer (resin) including the first unit represented by the general formula of Chemical Formula 15 and the second unit represented by the general formula of Chemical Formula 16, specific examples of the straight-chain alkyl group or the branched or cyclic alkyl group with a carbon number not less than 1 and not more than 20 are a methyl group, an ethyl group, a propyl group, an isopropyl group, a n-propyl group, a n-butyl group, a sec-butyl group, a tert-butyl group, a cyclopentyl group, a cyclohexyl group, a cyclohexylmethyl group, a 2-ethylhexyl group, a n-octyl group, a 2-adamantyl group and a (2-adamantyl)methyl group. In any of these groups, the carbon number is preferably not less than 1 and not more than 12 and is more preferably not less than 1 and not more than 10.

Furthermore, in the polymer (resin) including the first unit represented by the general formula of Chemical Formula 15 and the second unit represented by the general formula of Chemical Formula 16, the fluoridated alkyl group may be any of the aforementioned alkyl groups in which fluorine atoms are substituted for part or whole of hydrogen atoms, and specific examples are a trifluoromethyl group, a 2,2,2-trifluoroethyl group, a 3,3,3-trifluoropropyl group, a 1,1,1,3,3,3-hexafluoroisopropyl group, a 1,1,2,2,3,3,3-heptafluoropropyl group, and groups represented by respective general formulas shown in Chemical Formula 17 below.

Chemical Formula 17:

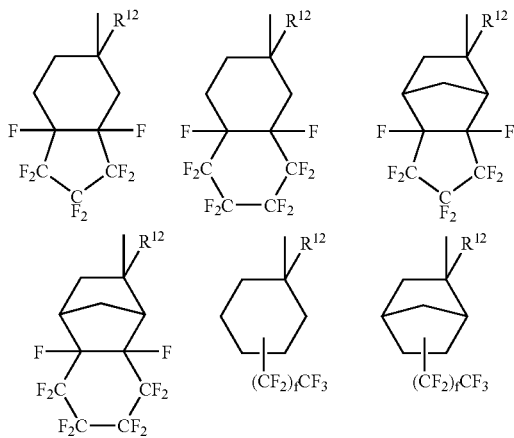

wherein $R^{12}$ is a hydrogen atom, a fluorine atom, or a straight-chain alkyl group, a branched or cyclic alkyl group or a fluoridated alkyl group with a carbon number not less than 1 and not more than 20, and f is an integer not less than 0 and not more than 10.

Now, the protecting group released by an acid (that is, $R^5$ or $R^6$) used in the polymer (resin) including the first unit represented by the general formula of Chemical Formula 15 will be described. As the protecting group, any of various groups can be used and in particular, a group represented by a general formula of Chemical Formula 18, 19 or 20 below is preferably used.

Chemical Formula 18:

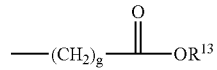

Chemical Formula 19:

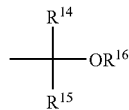

Chemical Formula 20:

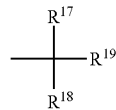

The general formula shown as Chemical Formula 18 will now be described.

In Chemical Formula 18, $R^{13}$ is a tertiary alkyl group with a carbon number not less than 4 and not more than 20 and preferably not less than 4 and not more than 15, an oxoalkyl group with a carbon number not less than 4 and not more than 20, or a group represented by Chemical Formula 20. Specific examples of the tertiary alkyl group are a tert-butyl group, a tert-amyl group, a 1,1-diethylpropyl group, a 1-ethylcyclopentyl group, a 1-butylcyclopentyl group, a 1-ethylcyclohexyl group, a 1-butylcyclohexyl group, a 1-ethyl-2-cyclopentenyl group, a 1-ethyl-2-cyclohexenyl group, a 2-methyl-2-adamantyl group, etc. Specific examples of the oxoalkyl group are a 3-oxocyclohexyl group, a 4-methyl-2-oxooxane-4-il group and a 5-methyl-5-oxooxolane-4-il group. Also, g is an integer not less than 0 and not more than 6.

Specific examples of the protecting group represented by Chemical Formula 18 are a tert-butoxycarbonyl group, a tert-butoxycarbonylmethyl group, a tert-amyloxycarbonyl group, a tert-amyloxycarbonylmethyl group, a 1,1-diethylpropyloxycarbonyl group, a 1,1-diethylpropyloxycarbonylmethyl group, a 1-ethylcyclopentyloxycarbonyl group, a 1-ethylcyclopentyloxycarbonylmethyl group, a 1-ethyl-2-cyclopentenyloxycarbonyl group, a 1-ethyl-2-cyclopentenyloxycarbonylmethyl group, a 1-ethoxyethoxycarbonylmethyl group, a 2-tetrahydropyranyloxycarbonylmethyl group, a 2-tetrahydrofuranyloxycarbonylmethyl group, etc.

Now, the general formula shown as Chemical Formula 19 will be described.

In Chemical Formula 19, $R^{14}$ and $R^{15}$ are the same or different and are a hydrogen atom, a straight-chain alkyl group or a branched or cyclic alkyl group with a carbon number not less than 1 and not more than 18 and preferably not less than 1 and not more than 10. Specific examples are a methyl group, an ethyl group, a propyl group, an isopropyl group, a n-butyl group, a sec-butyl group, a tert-butyl group, a cyclopentyl group, a cyclohexyl group, a 2-ethylhexyl group and a n-octyl group.

Furthermore, in Chemical Formula 19, $R^{16}$ is a univalent carbon hydride group (which may include a hetero atom such as an oxygen atom) with a carbon number not less than 1 and not more than 18 and preferably not less than 1 and not more than 10, and may be a straight-chain, branched or cyclic alkyl group, or such an alkyl group in which hydroxyl groups, alkoxy groups, oxo groups, amino groups or alkylamino groups are substituted for part of hydrogen atoms. Specific examples of $R^{16}$ are substituted alkyl groups shown in Chemical Formula 21 below.

Chemeical Formula 21:

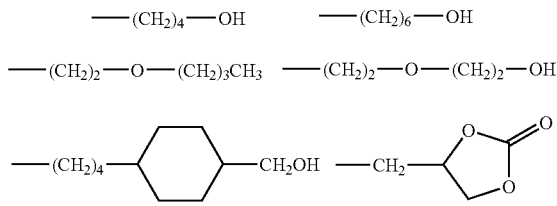

In Chemical Formula 19, each of pairs of $R^{14}$ and $R^{15}$, $R^{14}$ and $R^{16}$, and $R^{15}$ and $R^{16}$ may be mutually bonded to form a ring. When they form a ring, each of $R^{14}$, $R^{15}$ and $R^{16}$ is a straight-chain or branched alkylene group with a carbon number not less than 1 and not more than 18 and preferably not less than 1 and not more than 10.

In the protecting group represented by Chemical Formula 19, specific examples of the straight-chain or branched alkylene group are groups shown in Chemical Formula 22 below. Among these groups, an alkoxyethyl group or an alkoxymethyl group are preferred. Also, examples of the alkoxyethyl group are an adamantyloxyethyl group, a t-butyloxyethyl group, an ethoxyethyl group and a methoxymethyl group. Examples of the alkoxymethyl group are an adamantyloxymethyl group, a t-butyloxymethyl group, an ethoxymethyl group and a methoxymethyl group.

Chemical Formula 22:

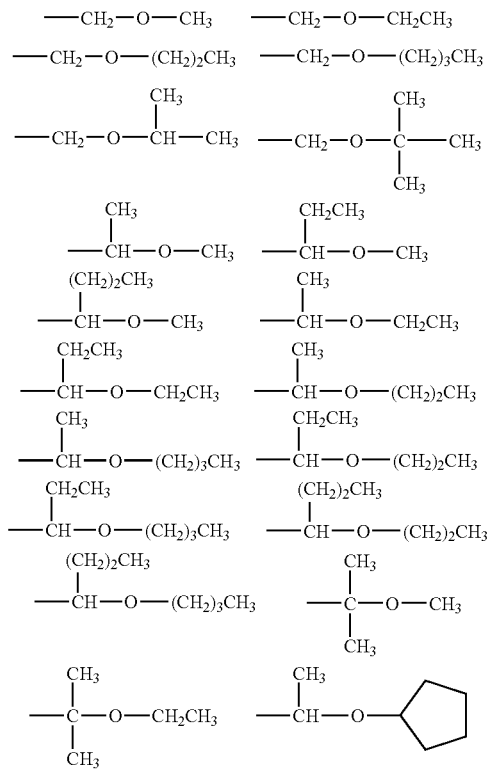

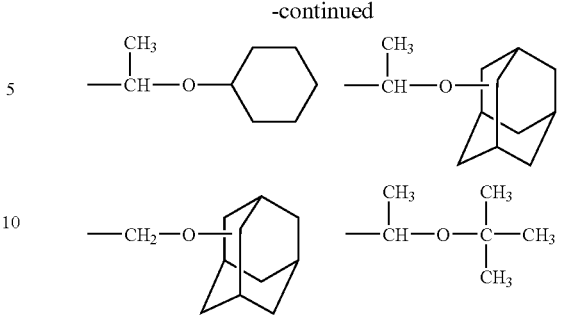

Also, in the protecting group represented by Chemical Formula 19, specific examples of the cyclic alkylene group are a tetrahydrofuran-2-il group, a 2-methyltetrahydrofuran-2-il group, a tetrahydropyran-2-il group and a 2-methyltetrahydropyran-2-il group.

Now, the general formula shown as Chemical Formula 20 will be described.

In Chemical Formula 20, each of $R^{17}$, $R^{18}$ and $R^{19}$ is a univalent carbon hydride group such as a straight-chain alkyl group or a branched or cyclic alkyl group with a carbon number not less than 1 and not more than 20, and may include a hetero atom such as oxygen, sulfur, nitrogen or fluorine.

In Chemical Formula 20, each of pairs of $R^{17}$ and $R^{18}$, $R^{17}$ and $R^{19}$, and $R^{18}$ and $R^{19}$ may be mutually bonded to form a ring together with a carbon atom bonded to these groups.

Specific examples of a tertiary alkyl group represented by Chemical Formula 20 are a tert-butyl group, a triethylcarbyl group, a 1-ethylnorbornyl group, a 1-methylcyclohexyl group, a 1-ethylcyclopentyl group, a 2-(2-methyl)adamantyl group, a 2-(2-ethyl)adamantyl group, a tert-amyl group, a 1,1,1,3,3,3-hexafluoro-2-methyl-isopropyl group, a 1,1,1,3,3,3-hexafluoro-2-cyclohexyl-isopropyl group and groups shown in Chemical Formula 23 below.

Chemical Formula 23:

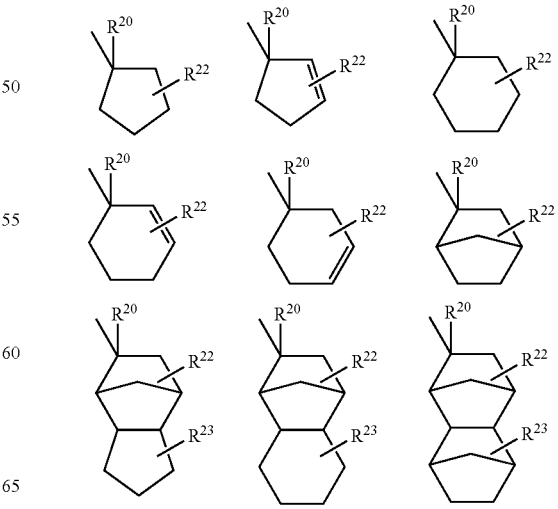

-continued

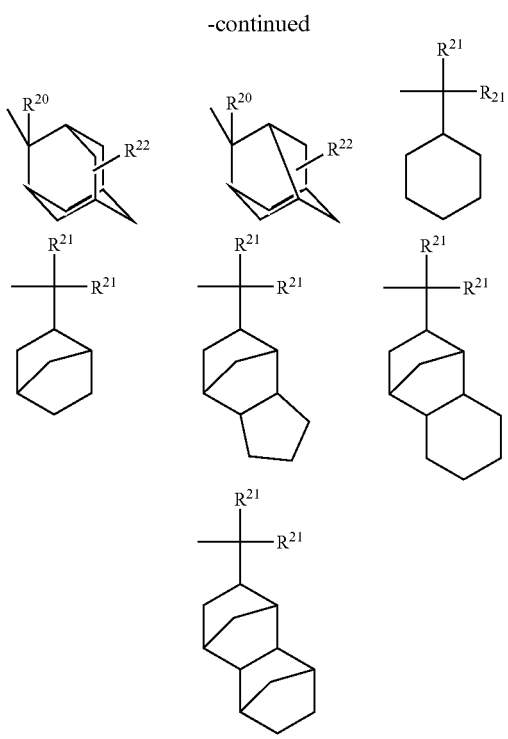

In Chemical Formula 23, $R^{20}$ is a straight-chain, branched or cyclic alkyl group with a carbon number not less than 1 and not more than 6, and specific examples are a methyl group, an ethyl group, a propyl group, an isopropyl group, a n-butyl group, a sec-butyl group, a n-pentyl group, a n-hexyl group, a cyclopropyl group, a cyclopropylmethyl group, a cyclobutyl group, a cyclopentyl group and a cyclohexyl group.

Also, in Chemical Formula 23, $R^{21}$ is a straight-chain, branched or cyclic alkyl group with a carbon number not less than 2 and not more than 6, and specific examples are an ethyl group, a propyl group, an isopropyl group, a n-butyl group, a sec-butyl group, a n-pentyl group, a n-hexyl group, a cyclopropyl group, a cyclopropylmethyl group, a cyclobutyl group, a cyclopentyl group and a cyclohexyl group.

Furthermore, in Chemical Formula 23, $R^{22}$ and $R^{23}$ are the same or different and are a hydrogen atom or a univalent carbon hydride group (which may include a hetero atom or may be bonded through a hetero atom) with a carbon number not less than 1 and not more than 6, and may be any of straight-chain, branched and cyclic groups. In this case, examples of the hetero atom are an oxygen atom, a sulfur atom, a nitrogen atom, —OH, —$OR^{24}$, —O—, —S—, —S(=O)—, —$NH_2$, —$NHR^{24}$, —$N(R^{24})_2$, —NH— and —$NR^{24}$—, wherein $R^{24}$ is an alkyl group.

Specific examples of $R^{22}$ and $R^{23}$ used in Chemical Formula 23 are a methyl group, a hydroxymethyl group, an ethyl group, a hydroxyethyl group, a propyl group, an isopropyl group, a n-butyl group, a sec-butyl group, a n-pentyl group, a n-hexyl group, a methoxy group, a methoxymethoxy group, an ethoxy group and a tert-butoxy group.

Embodiment 2

A pattern formation method according to Embodiment 2 of the invention will now be described.

In the pattern formation method of Embodiment 2, the resist material according to Embodiment 1 is used, and the pattern formation method includes the following procedures:

First, the resist material according to Embodiment 1 is applied on a substrate such as a silicon wafer in a thickness of 0.1 through 1.0 μm by spin coating or the like. Thereafter, the resultant substrate is subjected to pre-bake by using a hot plate at a temperature of 60 through 200° C. for 10 seconds through 10 minutes and preferably at a temperature of 80 through 150° C. for 30 seconds through 5 minutes. Thus, a resist film is formed.

Next, the resist film is irradiated through a photomask having a desired pattern with high energy beams such as deep UV, excimer laser or X-rays, or electron beams at exposure of approximately 1 through 200 mJ/cm$^2$ and preferably approximately 10 through 100 mJ/cm$^2$. Thereafter, the resultant is subjected to post-exposure bake (PEB) by using a hot plate at a temperature of 60 through 150° C. for 10 seconds through 5 minutes and preferably at a temperature of 80 through 130° C. for 30 seconds through 3 minutes.

Next, the resultant resist film is developed by using a developer of an alkaline aqueous solution, such as tetramethylammonium hydroxide (TMAH), with a concentration of 0.1 through 5% and preferably 2 through 3% for 10 seconds through 3 minutes and preferably 30 seconds through 2 minutes. Thus, a resist pattern is formed. For this development, any of known methods such as a dip method, a puddle method and a spray method can be employed.

In Embodiment 2, the exposing light may be deep UV or excimer laser of a wavelength of a 254 nm through 120 nm band, and in particular, high energy beams such as KrF laser of a wavelength of a 248 nm band, ArF laser of a wavelength of a 193 nm band, $F_2$ laser of a wavelength of a 157 nm band, $Kr_2$ laser of a wavelength of a 146 nm band, KrAr laser of a wavelength of a 134 nm band, $Ar_2$ laser of a wavelength of a 126 nm band or soft X-rays, or electron beams. Thus, a fine resist pattern can be formed.

Now, specific experimental examples practiced for evaluating the pattern formation method of Embodiment 2 will be described with reference to FIG. 3.

Figure 3:
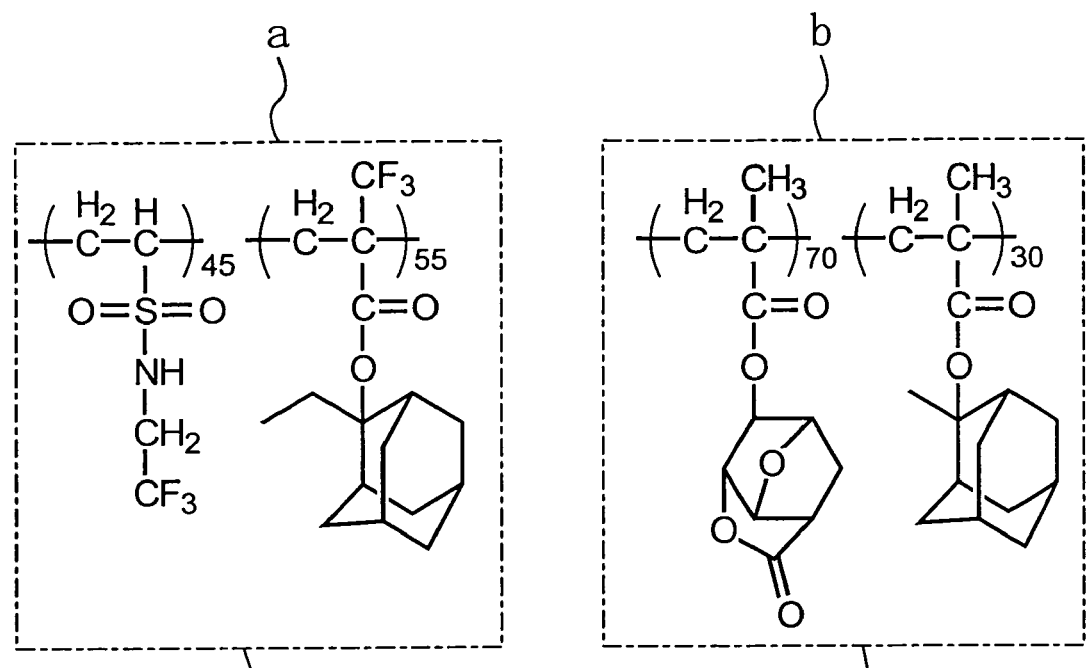
FIG. 3 is a diagram for showing an exemplified experiment performed for evaluating the pattern formation method according to Embodiment 2.
Figure 3:
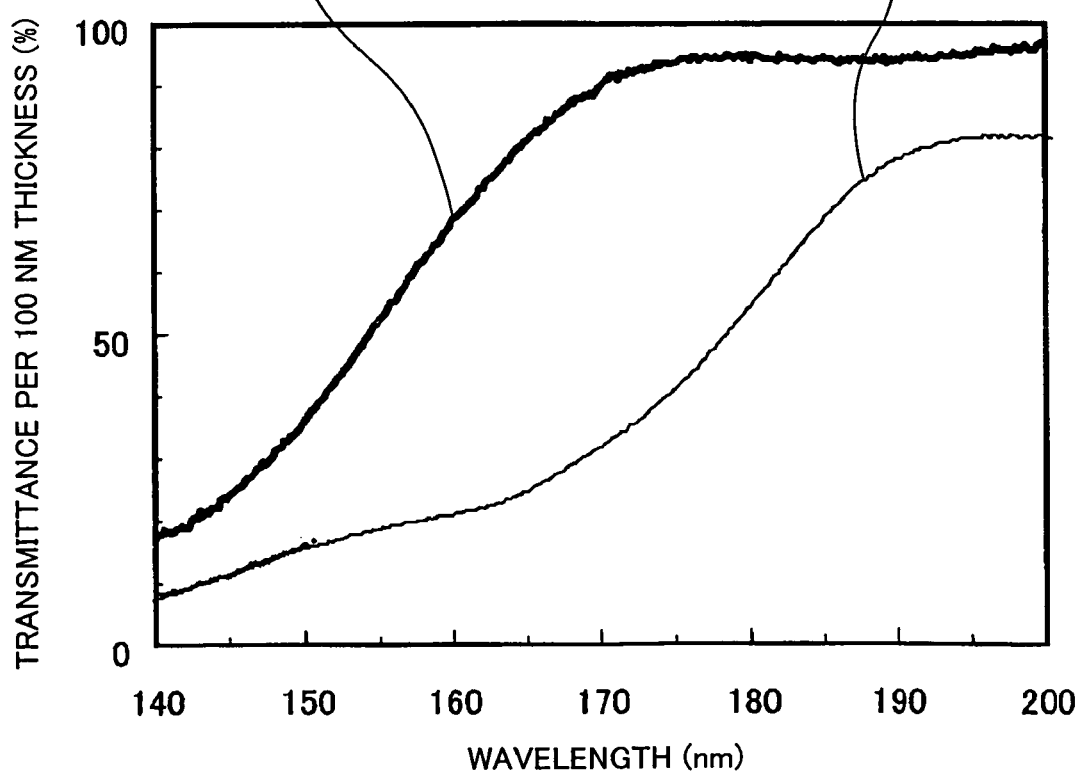

In FIG. 3, the abscissa indicates the wavelength region of exposing light from 140 nm to 200 nm, and the ordinate indicates the transmittance (%) of the exposing light against per 100 nm thickness of a resist from 0% through 100%. Herein, two kinds of base polymers respectively having different basic skeletons are examined, and change of the transmittance in accordance with the wavelength of the exposing light is shown.

As is understood from FIG. 3, in the pattern formation method of Embodiment 2, the transmittance of the exposing light is improved when a unit having a vinyl sulfonamide group on a side chain is introduced as the base polymer as shown in a broken line box a of FIG. 3 than when a polymer of an acrylic unit is used as the base polymer as shown in a broken line box b of FIG. 3. In particular, the transmittance is largely improved in an exposing light wavelength region of 150 nm through 170 nm probably because a substituent group including fluorine is present in every unit of the polymer shown in the broken line box a of FIG. 3. It is noted that the high polymerization reaction speed of the acrylic unit can be suppressed when not a methyl group shown in the broken line box b of FIG. 3 but an ethyl group is bonded, as shown in the broken line box a, to carbon to which an ester group and an adamantyl group are bonded in the resin of the acrylic unit having the adamantyl group on the terminal of the ester group. Therefore, as shown in the broken line box a of FIG. 3, the unit having a sulfonamide group with a low polymerization reaction speed can be polymerized in the acrylic resin with a high polymerization reaction speed in comparatively uniform ratios (that is, in substantially uniform ratios of 45% in the broken line box a of FIG. 3). Accordingly, a base polymer with high polymerization uniformity and high etching resistance can be obtained.

EXAMPLE 1

Example 1 for embodying the chemically amplified resist material of Embodiment 1 and the pattern formation method of Embodiment 2 will now be described with reference to FIGS. 1A through 1D.

First, a chemically amplified resist material having the following composition is prepared:

Base polymer: polymer in which a first unit represented by Chemical Formula 24 and a second unit represented by Chemical Formula 25 are polymerized Acid generator: triphenylsulfonium nonaflate (2 wt % based on the base polymer)

Solvent: propylene glycol monomethyl ether acetate

Chemical Formula 24:

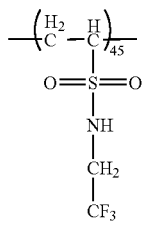

Chemical Formula 25:

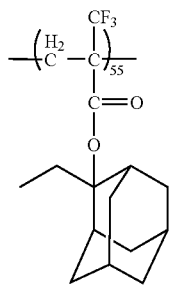

Next, as shown in FIG. 1A, the chemically amplified resist material having the above-described composition is applied on a semiconductor substrate 10 by spin coating, thereby forming a resist film 11 with a thickness of 0.2 μm. At this point, since the base polymer is alkali-insoluble, the resist film 11 is alkali-insoluble.

Figure 1B:
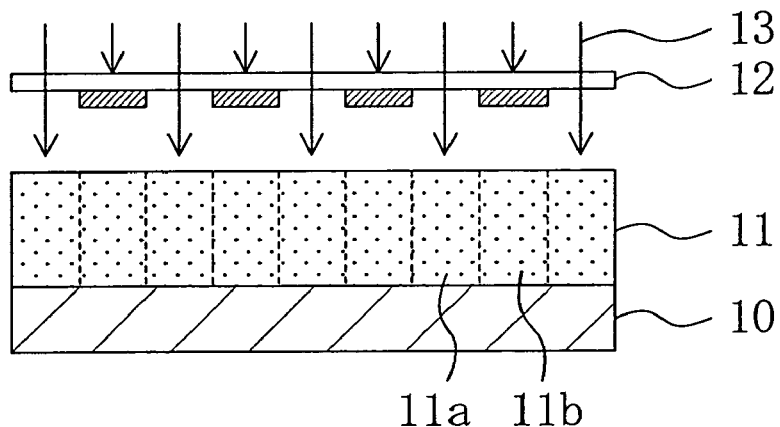

Next, as shown in FIG. 1B, the resist film 11 is subjected to pattern exposure by irradiating through a mask 12 with exposing light 13 of $F_2$ laser (of a wavelength of a 157 nm band). Thus, an acid is generated from the acid generator in an exposed portion 11a of the resist film 11 while no acid is generated in an unexposed portion 11b of the resist film 11.

Figure 1C:
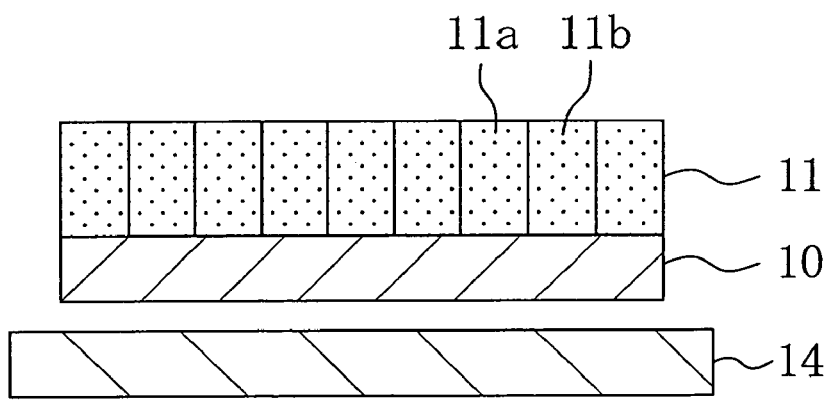

Then, as shown in FIG. 1C, the semiconductor substrate 10 together with the resist film 11 is heated with a hot plate 14. Thus, the base polymer is heated in the presence of the acid in the exposed portion 11a of the resist film 11, so as to release a protecting group in the second unit. As a result, the base polymer becomes alkali-soluble.

Figure 1D:
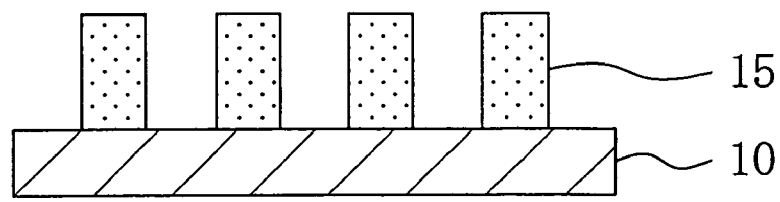

Subsequently, the resist film 11 is developed with an alkaline developer such as a tetramethylammonium hydroxide aqueous solution. Thus, the exposed portion 11a of the resist film 11 is dissolved in the developer, so that a resist pattern 15 made of the unexposed portion 11b of the resist film 11 can be formed as shown in FIG. 1D.

It is noted that the base polymer includes the unit represented by Chemical Formula 24 in a ratio of approximately 25% of the whole base polymer and the unit represented by Chemical Formula 25 in a ratio of approximately 55% of the whole base polymer.

In the case where the base polymer includes a plurality of kinds of units in this manner, the respective units are preferably polymerized in a comparatively homogeneous state. When the different units are well mixed in the base polymer by reducing imbalance of kinds of the polymerization units by preventing a given unit from polymerizing locally in a given portion of the base polymer, the respective units can be polymerized in such a manner as to be engaged with one another, and hence, the skeleton strength of the resultant base polymer can be improved. Therefore, an effect to improve the transparency and the hydrophilic property owing to the sulfonamide group can be attained, and in addition, the base polymer with high polymerization uniformity that includes at least two kinds of units is provided, so that the etching resistance can be improved. As a result, a resist pattern can be formed in a good shape.

EXAMPLE 2

Example 2 for embodying the chemically amplified resist material according to Embodiment 1 and the pattern formation method according to Embodiment 2 will now be described. Since Example 2 is different from Example 1 merely in the chemically amplified resist material, the resist material alone will be herein described.

A chemically amplified resist material having the following composition is prepared:

Base polymer: polymer in which a first unit represented by Chemical Formula 26 and a second unit represented by Chemical Formula 27 are polymerized Acid generator: triphenylsulfonium triflate (3 wt % based on the base polymer)

Solvent: propylene glycol monomethyl ether acetate

Chemical Formula 26:

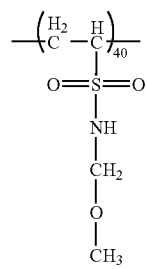

Chemical Formula 27:

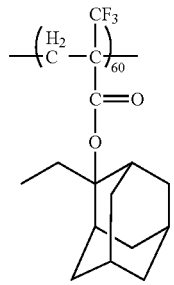

Embodiment 3

A pattern formation method according to Embodiment 3 of the invention will now be described.

In the pattern formation method of Embodiment 3, immersion lithography for performing exposure with water provided between a resist film and an exposure lens is carried out by using the resist material according to Embodiment 1. This pattern formation method includes the following procedures:

First, the resist material according to Embodiment 1 is applied on a substrate such as a silicon wafer in a thickness of 0.1 through 1.0 μm by spin coating or the like. Thereafter, the resultant substrate is subjected to pre-bake by using a hot plate at a temperature of 60 through 200° C. for 10 seconds through 10 minutes and preferably at a temperature of 80 through 150° C. for 30 seconds through 5 minutes. Thus, a resist film is formed.

Next, with a liquid supplied on the resist film, the resist film is irradiated through a photomask having a desired pattern with high energy beams such as deep UV, excimer laser or X-rays, or electron beams at exposure of approximately 1 through 200 mJ/cm$^2$ and preferably approximately 10 through 100 mJ/cm$^2$.

Thereafter, the resultant is subjected to post-exposure bake (PEB) by using a hot plate at a temperature of 60 through 150° C. for 10 seconds through 5 minutes and preferably at a temperature of 80 through 130° C. for 30 seconds through 3 minutes.

Next, the resultant resist film is developed by using a developer of an alkaline aqueous solution, such as tetramethylanunonium hydroxide (TMAH), with a concentration of 0.1 through 5% and preferably 2 through 3% for 10 seconds through 3 minutes and preferably 30 seconds through 2 minutes. Thus, a resist pattern is formed. For this development, any of known methods such as a dip method, a puddle method and a spray method can be employed.

In Embodiment 3, the exposing light may be deep UV or excimer laser of a wavelength of a 254 nm through 120 nm band, and in particular, high energy beams such as KrF laser of a wavelength of a 248 nm band, ArF laser of a wavelength of a 193 nm band, F$_2$ laser of a wavelength of a 157 nm band, Kr$_2$ laser of a wavelength of a 146 nm band, KrAr laser of a wavelength of a 134 nm band, Ar$_2$ laser of a wavelength of a 126 nm band or soft X-rays, or electron beams. Thus, a fine resist pattern can be formed.

Apart from water, a liquid (having a refractive index n) such as perfluoropolyether may be supplied on the resist film 11 in the pattern exposure for selectively irradiating the resist film with the exposing light. When such immersion lithography is performed, since a region between a condensing lens and the resist film in an exposure system is filled with the liquid having a refractive index n, the value of NA (numerical aperture) of the exposure system becomes a value n·NA, and hence, the resolution of the resist film is improved.

EXAMPLE 3

Example 3 for embodying the chemically amplified resist material according to Embodiment 1 and the pattern formation method according to Embodiment 3 will now be described with reference to FIGS. 2A through 2D.

First, a chemically amplified resist material having the following composition is prepared:

Base polymer: polymer in which a first unit represented by Chemical Formula 28 and a second unit represented by Chemical Formula 29 are polymerized Acid generator: triphenylsulfonium triflate (2 wt % based on the base polymer)

Solvent: propylene glycol monomethyl ether acetate

Chemical Formula 28:

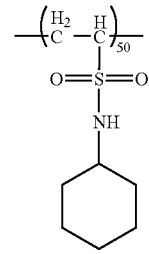

Chemical Formula 29:

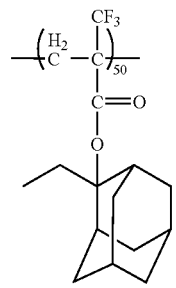

Figure 2A:
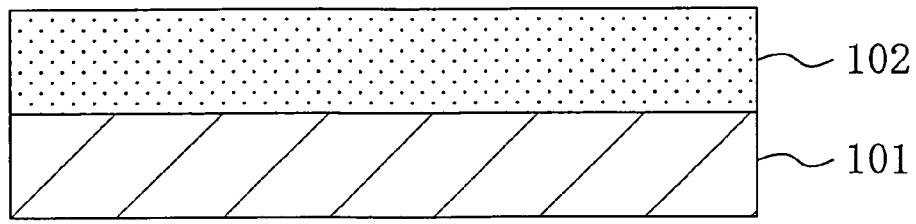
FIGS. 2A, 2B, 2C and 2D are cross-sectional views for showing procedures in a pattern formation method of Example 2 for embodying Embodiment 3 of the invention.

Next, as shown in FIG. 2A, the chemically amplified resist material having the above-described composition is applied on a semiconductor substrate 101 by spin coating, thereby forming a resist film 102 with a thickness of 0.2 μm. At this point, since the base polymer is alkali-insoluble, the resist film 102 is alkali-insoluble.

Figure 2B:
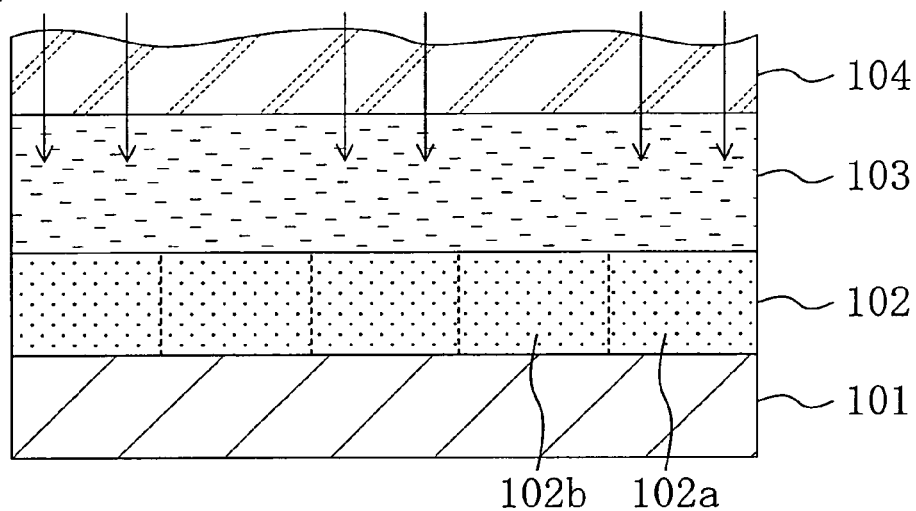

Next, as shown in FIG. 2B, the resist film 102 is subjected to pattern exposure by irradiating through an exposure lens 104 with exposing light of ArF laser (of a wavelength of a 193 nm band) with water 103 (having a refractive index n of 1.44) provided on the resist film 102. Thus, an acid is generated from the acid generator in an exposed portion 102a of the resist film 102 while no acid is generated in an unexposed portion 102b of the resist film 102.

Figure 2C:
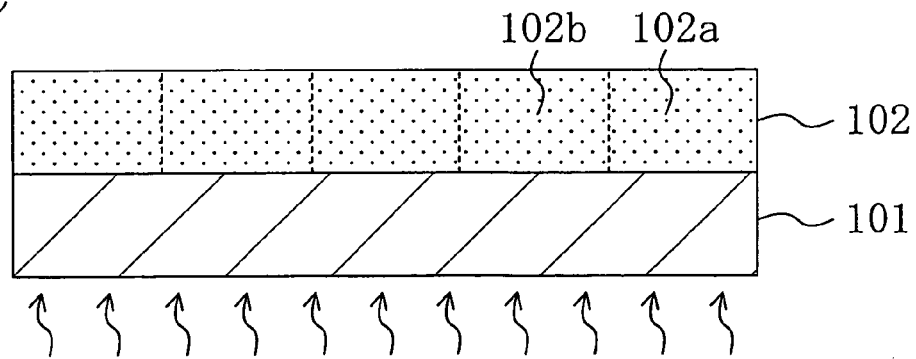

Then, as shown in FIG. 2C, the semiconductor substrate 101 together with the resist film 102 is heated with a hot plate. Thus, the base polymer is heated in the presence of the acid in the exposed portion 102a of the resist film 102, so as to release a protecting group in the second unit. As a result, the base polymer becomes alkali-soluble.

Figure 2D:
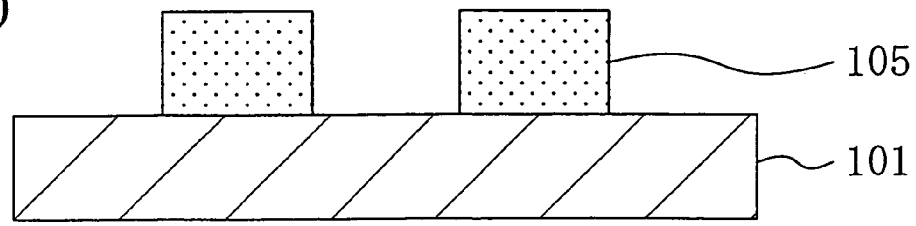

Subsequently, the resist film 102 is developed with an alkaline developer such as a tetramethylammonium hydroxide aqueous solution. Thus, the exposed portion 102a of the resist film 102 is dissolved in the developer, so that a resist pattern 105 made of the unexposed portion 102b of the resist film 102 can be formed as shown in FIG. 2D.

It is noted that the base polymer includes the first unit represented by Chemical Formula 28 in a ratio of approximately 50% of the whole base polymer and the second unit represented by Chemical Formula 29 in a ratio of approximately 50% of the whole base polymer.

In the case where the base polymer includes a plurality of kinds of units in this manner, the respective units are preferably polymerized in a comparatively homogeneous arrangement state. If one of the plural kinds of units is continuously polymerized in a given portion, the polymerization balance of the whole base polymer is degraded. Therefore, when the different units are well mixed in the base polymer by preventing a given unit from polymerizing locally in a given portion of the base polymer, the balance in the whole polymer can be improved. Also, since the respective units can be polymerized in such a manner as to be engaged with one another, the skeleton strength of the resultant base polymer can be improved. Therefore, the effect to improve the transparency and the hydrophilic property owing to the sulfonamide group can be attained, and in addition, the etching resistance is improved. In other words, when a base polymer with high polymerization uniformity that includes at least two kinds of units is provided, the etching resistance can be improved so that a resist pattern can be formed in a good shape.

In addition, when the polymerization uniformity of the units used for forming a resist film is improved, particularly in employing the exposure by the immersion lithography, permeation of an immersion liquid into the resist film and elution of components of the resist film into the immersion liquid can be suppressed. This is because, when the polymerization uniformity is high, different kinds of units are engaged with one another so as to be sterically bonded to one another in a resultant polymer structure, and hence, the structure of the resultant resist film is complicated. Accordingly, even in the exposure by the immersion lithography in which the immersion liquid and the resist film are in direct contact with each other, the elution of a resist component into the liquid and the mixture of the immersion liquid with a resist component can be prevented. As a result, a pattern can be accurately formed.

The resist material or the pattern formation method of this invention is particularly suitable to a method for forming a fine resist pattern in a shape vertical to a substrate by using exposing light of KrF laser, ArF laser, $F_2$ laser, KrAr laser or $Ar_2$ laser.

What is claimed is:

1. A resist material comprising a base polymer containing a compound including a copolymer of a first unit represented by a general formula of the following Chemical Formula 1 and a second unit represented by a general formula of the following Chemical Formula 2:

Chemical Formula 1:

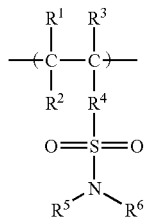

Chemical Formula 2:

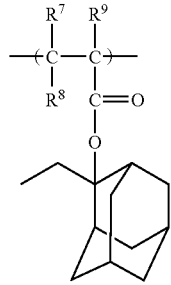

wherein $R^1$, $R^2$, $R^3$, $R^7$ and $R^8$ are the same or different and are a hydrogen atom, a fluorine atom, or a straight-chain alkyl group, a branched or cyclic alkyl group or a fluoridated alkyl group with a carbon number not less than 1 and not more than 20; $R^4$ is a straight-chain alkylene group or a branched or cyclic alkylene group with a carbon number not less than 0 and not more than 20; $R^5$ and $R^6$ are the same or different and are a hydrogen atom, a straight-chain alkyl group, a branched or cyclic alkyl group or a fluoridated alkyl group with a carbon number not less than 1 and not more than 20, or a protecting group released by an acid; and $R^9$ is a fluorine atom, or a straight-chain alkyl group, a branched or cyclic alkyl group or a fluoridated alkyl group with a carbon number not less than 1 and not more than 20.

2. The resist material of claim 1,
wherein said base polymer further includes an acid generator for generating an acid through irradiation with light.

3. The resist material of claim 2,
wherein said base polymer further includes a dissolution inhibitor for inhibiting dissolution of said base polymer.

4. The resist material of claim 1,
wherein said compound including said copolymer has a structure in which said first unit and said second unit are alternately arranged.

5. The resist material of claim 1,
wherein said protecting group released by an acid is an acetal group.

6. The resist material of claim 5,
wherein said acetal group is an alkoxyethyl group or an alkoxymethyl group.

7. The resist material of claim 6,
wherein said alkoxyethyl group is an adamantyloxyethyl group, a t-butyloxyethyl group, an ethoxyethyl group or a methoxyethyl group, and
said alkoxymethyl group is an adamantyloxymethyl group, a t-butyloxymethyl group, an ethoxymethyl group or a methoxymethyl group.

8. A pattern formation method comprising the steps of:
forming a resist film having a base polymer containing a compound including a copolymer of a first unit represented by a general formula of the following Chemical Formula 3 and a second unit represented by a general formula of the following Chemical Formula 4;
performing pattern exposure by selectively irradiating said resist film with exposing light of high energy beams of a wavelength not shorter than a 100 nm band and not longer than a 300 nm band or not shorter than a 1 nm band and not longer than a 30 nm band or electron beams; and
forming a resist pattern by developing said resist film after the pattern exposure:

Chemical Formula 3:

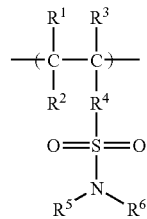

Chemical Formula 4:

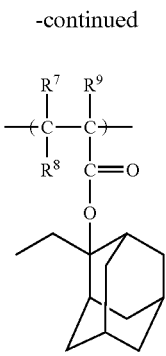

wherein $R^1$, $R^2$, $R^7$ and $R^8$ are the same or different and are a hydrogen atom, a fluorine atom, or a straight-chain alkyl group, a branched or cyclic alkyl group or a fluoridated alkyl group with a carbon number not less than 1 and not more than 20; $R^4$ is a straight-chain alkylene group or a branched or cyclic alkylene group with a carbon number not less than 0 and not more than 20; $R^5$ and $R^6$ are the same or different and are a hydrogen atom, a straight-chain alkyl group, a branched or cyclic alkyl group or a fluoridated alkyl group with a carbon number not less than 1 and not more than 20, or a protecting group released by an acid; and $R^9$ is a fluorine atom, or a straight-chain alkyl group, a branched or cyclic alkyl group or a fluoridated alkyl group with a carbon number not less than 1 and not more than 20.

9. The pattern formation method of claim 8,
wherein said base polymer further includes an acid generator for generating an acid through irradiation with light.

10. The pattern formation method of claim 9,
wherein said base polymer further includes a dissolution inhibitor for inhibiting dissolution of said base polymer.

11. The pattern formation method of claim 8,
wherein said compound including said copolymer has a structure in which said first unit and said second unit are alternately arranged.

12. The pattern formation method of claim 8,
wherein said protecting group released by an acid is an acetal group.

13. The pattern formation method of claim 8,
wherein said exposing light is KrF laser, ArF laser, $F_2$ laser, $Kr_2$ laser, KrAr laser, $Ar_2$ laser or soft X-rays.

14. The pattern formation method of claim 8,
wherein said base polymer has a trifluoromethyl group on a side chain thereof.

15. A pattern formation method comprising the steps of:
forming a resist film having a base polymer containing a compound including a copolymer of a first unit represented by a general formula of the following Chemical Formula 5 and a second unit represented by a general formula of the following Chemical Formula 6;
providing a liquid onto said resist film;
performing pattern exposure by selectively irradiating said resist film with exposing light of high energy beams of a wavelength not shorter than a 100 nm band and not longer than a 300 nm band or not shorter than a 1 nm band and not longer than a 30 nm band or electron beams; and
forming a resist pattern by developing said resist film after the pattern exposure:

Chemical Formula 5:

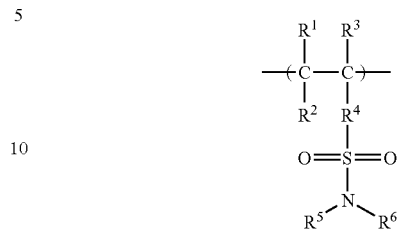

Chemical Formula 6:

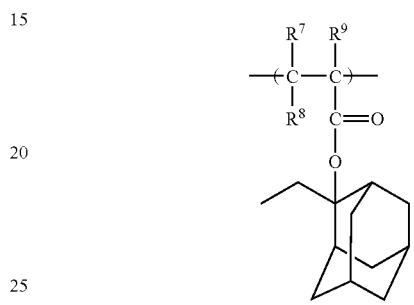

wherein $R^1$, $R^2$, $R^3$, $R^7$ and $R^8$ are the same or different and are a hydrogen atom, a fluorine atom, or a straight-chain alkyl group, a branched or cyclic alkyl group or a fluoridated alkyl group with a carbon number not less than 1 and not more than 20; $R^4$ is a straight-chain alkylene group or a branched or cyclic alkylene group with a carbon number not less than 0 and not more than 20; $R^5$ and $R^6$ are the same or different and are a hydrogen atom, a straight-chain alkyl group, a branched or cyclic alkyl group or a fluoridated alkyl group with a carbon number not less than 1 and not more than 20, or a protecting group released by an acid; and $R^9$ is a fluorine atom, or a straight-chain alkyl group, a branched or cyclic alkyl group or a fluoridated alkyl group with a carbon number not less than 1 and not more than 20.

16. The pattern formation method of claim 15,
wherein said base polymer further includes an acid generator for generating an acid through irradiation with light.

17. The pattern formation method of claim 16,
wherein said base polymer further includes a dissolution inhibitor for inhibiting dissolution of said base polymer.

18. The pattern formation method of claim 15,
wherein said compound including said copolymer has a structure in which said first unit and said second unit are alternately arranged.

19. The pattern formation method of claim 15,
wherein said protecting group released by an acid is an acetal group.

20. The pattern formation method of claim 15,
wherein said liquid is water or perfluoropolyether.

21. The pattern formation method of claim 15,
wherein said exposing light is KrF laser, ArF laser, $F_2$ laser, $Kr_2$ laser, KrAr laser, $Ar_2$ laser or soft X-rays.

22. The pattern formation method of claim 15,
wherein said base polymer has a trifluoromethyl group on a side chain thereof.

* * * * *